United States Patent [19]
Ferguson, Jr.

[11] Patent Number: 5,323,158
[45] Date of Patent: Jun. 21, 1994

[54] SWITCHED CAPACITOR ONE-BIT DIGITAL-TO-ANALOG CONVERTER

[75] Inventor: Paul F. Ferguson, Jr., Dracut, Mass.

[73] Assignee: Analog Devices, Inc., Wilmington, Mass.

[21] Appl. No.: 43,261

[22] Filed: Apr. 6, 1993

[51] Int. Cl.⁵ .............................. H03M 3/02
[52] U.S. Cl. .............................. 341/143; 341/150
[58] Field of Search ............... 341/143, 155, 139, 166, 341/144; 375/25, 26

[56] References Cited

U.S. PATENT DOCUMENTS 5,150,120  9/1992  Yunus ........................ 341/143
5,187,482  2/1993  Tiemann et al. ............. 341/143

OTHER PUBLICATIONS

Ribner et al, "Biquad Alternatives for High-Frequency Switched Capacitor Filters", IEEE J. Solid-State Circuits, vol. SC-20, No. 6, Dec. 1985, pp. 1085-1095.
Senderowicz et al, "A Family of Differential NMOS Analog Circuits for PCM Codec Filter Chip", IEEE J. Solid-State Circuits, vol. SC-17, No. 6, Dec. 1982, pp. 1014-1023.
Sarhang-Nejad et al, "A True 16-Bit 20KHz Multibit ΣΔ ADC With Digital Correction", IEEE 1992 Custom Integrated Circuits Conf., pp. 16.4.1-16.4.4.

Primary Examiner—Brian K. Young
Attorney, Agent, or Firm—Wolf, Greenfield & Sacks

[57] ABSTRACT

A switched capacitor one-bit digital-to-analog converter is preferably utilized in the feedback path of a sigma delta modulator. The one-bit digital-to-analog converter includes first and second capacitors, a first switching circuit for coupling charge from a reference source to the capacitors, and a second switching circuit for coupling charge from the capacitors to positive and negative outputs, such as the summing junction of an operational amplifier. The switches in the second switching circuit have a cross-coupled configuration and are controlled by data dependent control signals. The data dependent control signals are structured such that charge is coupled from the capacitors to the summing junction on both clock phases, regardless of the state of the data. As a result, the sizes of the capacitors can be reduced by a factor of two for the same charge transfer.

10 Claims, 4 Drawing Sheets

SWITCHED CAPACITOR ONE-BIT DIGITAL-TO-ANALOG CONVERTER

FIELD OF THE INVENTION

This invention relates to switched capacitor circuits and, more particularly, to switched capacitor one-bit digital-to-analog converters. The switched capacitor one-bit digital-to-analog converters of the present invention are particularly useful in sigma delta analog-to digital converters, but are not limited to such use.

BACKGROUND OF THE INVENTION

Sigma delta analog-to-digital converters (ADC's) and digital-to-analog converters (DAC's) have recently come into widespread use with the development of suitable process technology and the increase in digital audio and other applications. Sigma delta converters exhibit excellent linearity and low quantization noise. Because sigma delta ADC's utilize oversampling (sampling at rates in excess of the Nyquist rate), applications of sigma delta ADC's are typically limited to measurement, voice band and audio frequency ranges. Sigma delta ADC's and DAC's are particularly useful in mixed signal integrated circuits in which ADC, digital signal processing and DAC functions are monolithically integrated.

An important component of a sigma delta ADC is a one-bit digital-to-analog converter which receives an input from a comparator connected to the output of a loop integrator. The one-bit DAC supplies an error signal to a summing junction at the input of the sigma delta modulator loop.

Switched capacitor circuits have been used to implement the one-bit DAC in sigma delta ADC's. Typically, the basic elements of a switched capacitor circuit are a capacitor and two switches. A charge is transferred from a voltage source to the capacitor through the first switch on a first clock phase. The first switch is opened, and the charge is transferred from the capacitor to an output through the second switch on a second clock phase. The switches are typically implemented as CMOS transistors.

A first prior art sigma delta modulator circuit is shown in FIG. 3. A one-bit DAC 10 is implemented as a switched capacitor circuit. Charge is coupled from a reference voltage source VREF to capacitors 12 and 14 through switches 16, 18, 20 and 22. The charge is transferred from switches 12 and 14 to the summing junctions 23A, 23B of an integrator 24 through switches 30, 32, 34 and 36. The switches 32 and 34 are controlled by a data dependent control signal formed by logically ANDing clock phase 1 ($\Phi_1$) with the output of comparator 38. Switches 30 and 36 are controlled by a data dependent control signal formed by logically ANDing clock phase 1 with the inverted comparator output. Charge is delivered to the summing junctions only on clock phase 1.

A second prior art circuit is shown in FIG. 4. A similar circuit is disclosed by M. Sarhang-Nejad et al in "A True 16-Bit 20 kHz Multibit Sigma Delta ADC With Digital Correction", *IEEE* 1992 *Custom Integrated Circuits Conference Proceedings*, pages 16.4.1 to 16.4.4. A one-bit DAC 40 is implemented as a switched capacitor circuit. A DAC 42 applies a data dependent reference voltage VREF to the switched capacitor circuit. The circuit of FIG. 4 does not utilize data dependent switching in the switched capacitor circuit. Charge is delivered to the summing junction only on one phase of the clock cycle. The circuit of FIG. 4 causes a nonlinear voltage dependent load on the voltage reference, which results in signal path distortion.

The prior art one-bit DAC circuits provide generally satisfactory performance. However, it is desirable to provide improved circuit structures, particularly with respect to reducing the circuit area requirements for integrated circuits.

SUMMARY OF THE INVENTION

According to the present invention, a switched capacitor one-bit digital-to-analog converter comprises first and second capacitors, each having a first lead and a second lead, first switching means connected to the first leads of the capacitors for coupling charge from a reference source to the capacitors, and second switching means connected to the second leads of the capacitors for coupling charge from the capacitors to a positive output and a negative output. The second switching means comprises a first switch connected between the first capacitor and the positive output, a second switch connected between the second capacitor and the negative output, a third switch connected between the first capacitor and the negative output, and a fourth switch connected between the second capacitor and the positive output. The one-bit digital-to-analog converter further includes means for applying a first control signal to the first and second switches, the first control signal comprising $\Phi_2 \bullet X + \Phi_1 \bullet XI$, where $\Phi_1$ and $\Phi_2$ represent clock phase 1 and clock phase 2, respectively, X and XI represent input data and inverted input data respectively, "$\bullet$" represents a logical AND operation and "+" represents a logical OR operation, and means for supplying a second control signal to the third and fourth switches, the second control signal comprising $\Phi_1 \bullet X + \Phi_2 \bullet XI$. The circuit of the invention uses data dependent switching to deliver charge on both clock phases. As a result, the same charge is delivered with one half the capacitance values as compared with prior art circuits.

The first switching means preferably comprises a fifth switch connected between the first capacitor and a positive input from the reference voltage, a sixth switch connected between the second capacitor and a negative input from the reference source, a seventh switch connected between the first capacitor and the negative input from the reference source, and an eighth switch connected between the second capacitor and the positive input from the reference source, means responsive to clock phase 1 for controlling the fifth and sixth switches, and means responsive to clock phase 2 for controlling the seventh and eighth switches.

The switches used in the circuit of the invention preferably comprise CMOS transistors.

According to another aspect of the invention, a sigma delta modulator comprises an integrator having a summing junction and providing an integrator output signal, a comparator responsive to the integrator output signal for providing a comparator output signal having a first state when the integrator output signal is greater than a reference level and a second state when the integrator output signal is less than the reference level, a switched capacitor one-bit digital-to-analog converter responsive to the comparator output signal for providing an error signal to the summing junction, and a switched capacitor input circuit for coupling an input signal to the summing junction. The switched capacitor one-bit digital-to-analog converter has the structure described above. Preferably, the switched capacitor input circuit has a cross coupled double sampling structure such that charge is coupled to the summing junction by the input circuit and by the one-bit digital-to-analog converter on both clock phase 1 and clock phase 2.

BRIEF DESCRIPTION OF THE DRAWINGS

For a better understanding of the present invention, together with other and further objects, advantages and capabilities thereof, reference is made to the accompanying drawings, which are incorporated herein by reference and in which.

DETAILED DESCRIPTION OF THE INVENTION

Figure 1A:
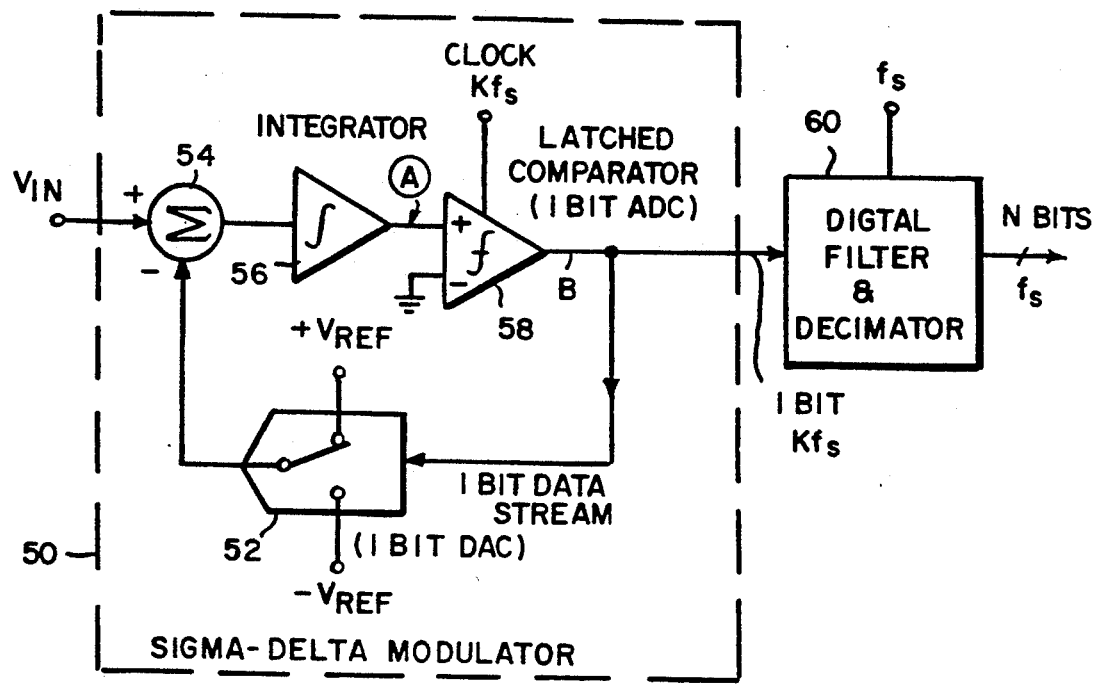
FIG. 1A is a block diagram of a sigma delta analog-to-digital converter.

A block diagram of a conventional first order sigma delta ADC is shown in FIG. 1A. A sigma delta modulator 50 converts an input signal into a continuous serial stream of ones and zeros at a rate determined by a sampling clock frequency $kf_s$. A one-bit DAC 52 is driven by the serial output data stream to generate an error signal. The output of DAC 52 is subtracted from the input signal in a summing unit 54. Typically, the summing unit 54 is implemented as the summing junction of an operational amplifier. An integrator 56 integrates the output of summing unit 54, and the output of the integrator 56 is applied to a clocked latched comparator 58.

Figure 1B:
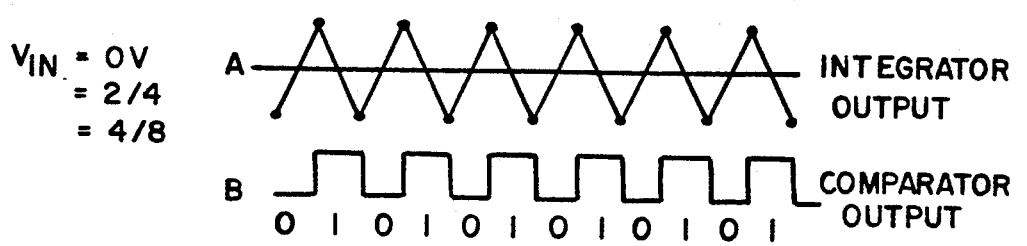
FIG. 1B is a timing diagram which illustrates waveforms in the sigma delta modulator of FIG. 1A.
Figure 1B:
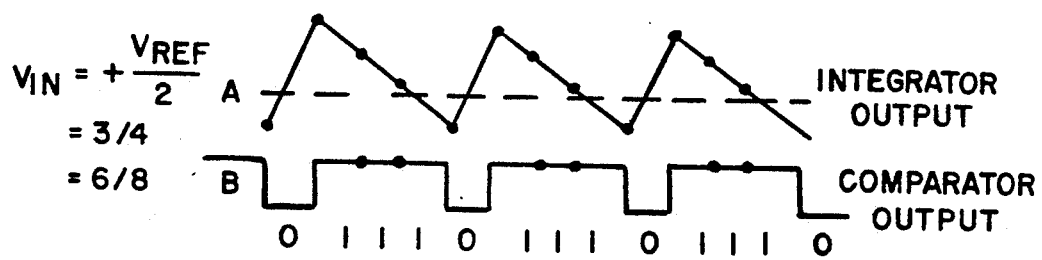

The outputs of the integrator and the comparator for two input conditions are shown in FIG. 1B. For an input signal of zero, the comparator output includes an approximately equal number of ones and zeros. For a positive input voltage, the comparator output contains more ones than zeros. The average value of the comparator output over a number of cycles represents the input voltage. The comparator output is applied to a digital filter and decimator 60 that averages every N cycles, where N is the resolution of the ADC. The decimator reduces the effective sampling rate at the output to $f_s$.

Figure 2:
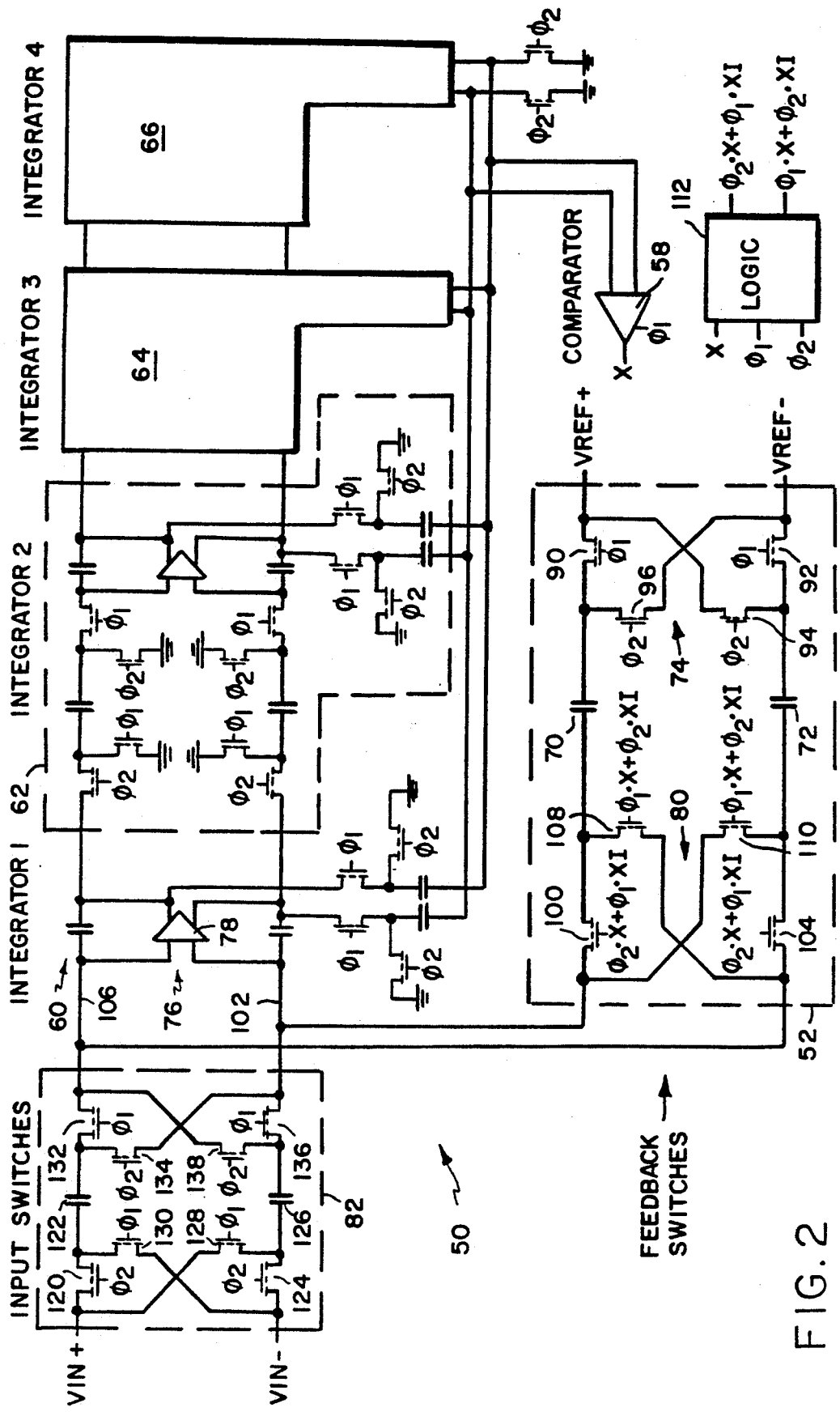
FIG. 2 is a schematic diagram of a sigma delta modulator including a one-bit digital-to-analog converter in accordance with the present invention.
Figure 3:
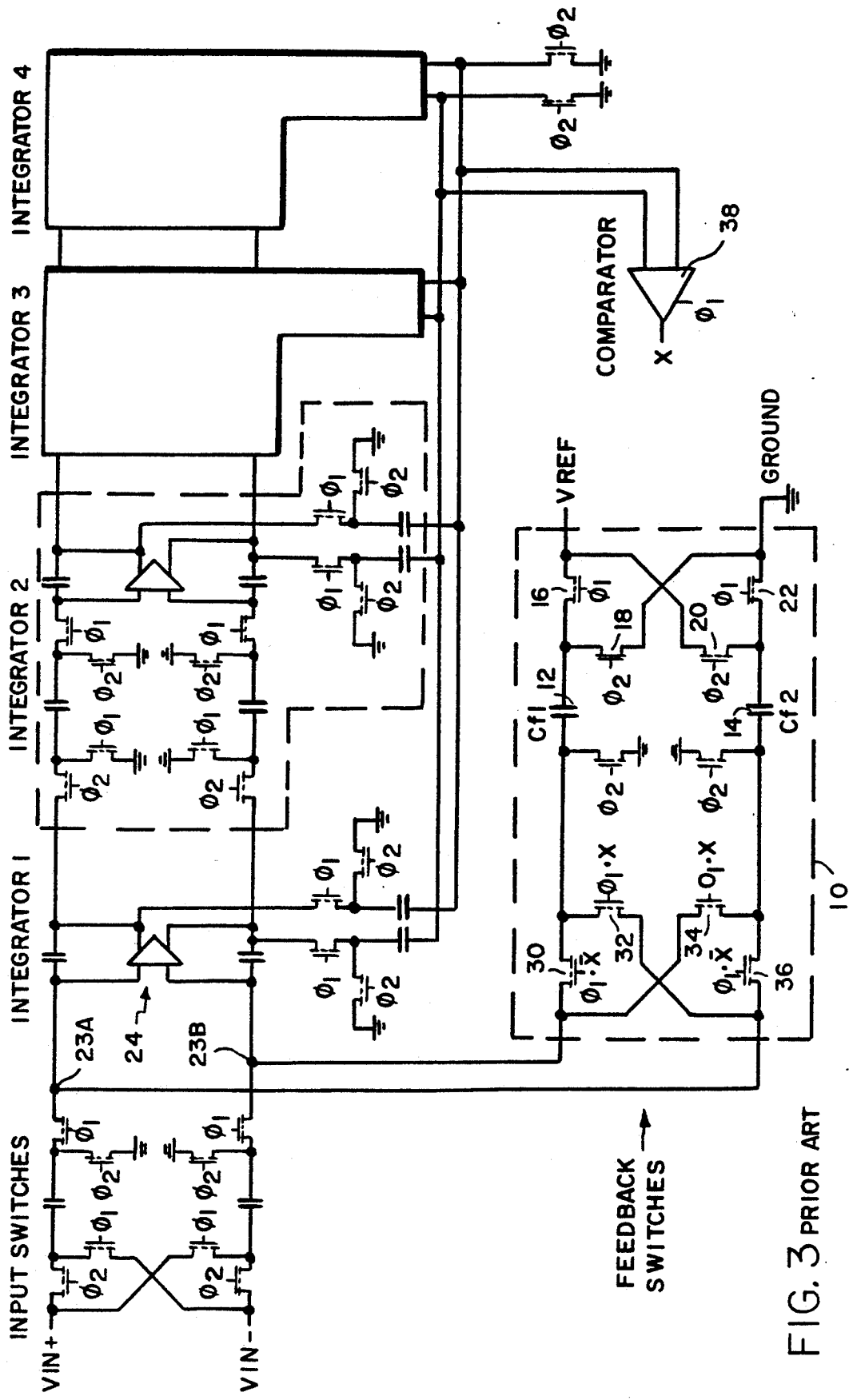
FIG. 3 is a schematic diagram of a first prior art sigma delta modulator.
Figure 4:
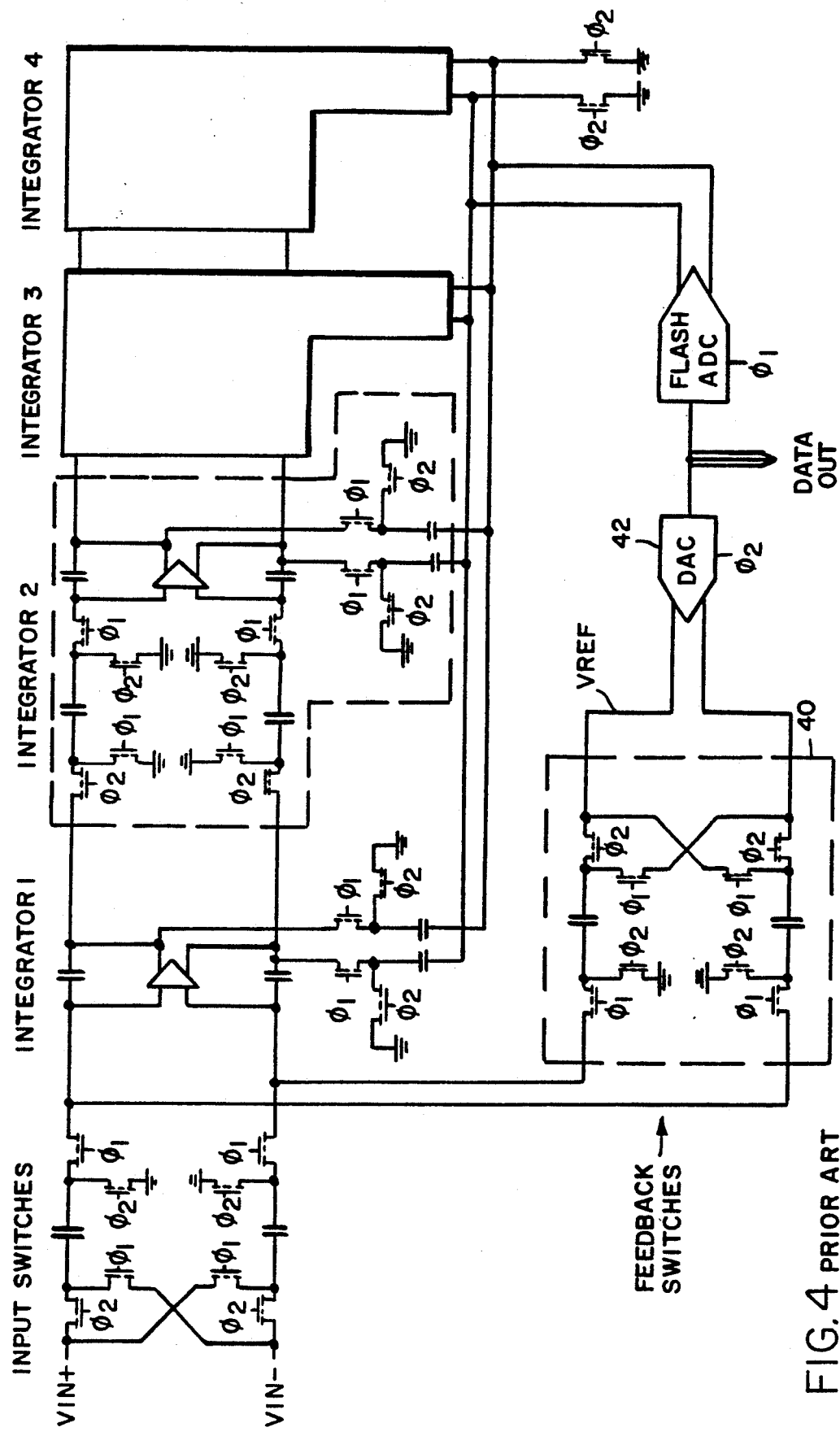
FIG. 4 is a schematic diagram of a second prior art sigma delta modulator.

A schematic diagram of the sigma delta modulator 50 in accordance with a preferred embodiment of the invention is shown in FIG. 2. In the embodiment of FIG. 2, the integrator 56 is implemented in four stages including integrator stages 60, 62, 64 and 66. Preferred circuit diagrams for integrator stages 60 and 62 are shown. Integrator stages 64 and 66 preferably have the same structure as integrator stage 62. It will be understood that different integrator circuits and different numbers of integrator stages can be utilized within the scope of the present invention. Preferably, the operational amplifiers used in the integrator have differential inputs and differential outputs.

The one-bit DAC 52 utilizes a switched capacitor circuit. Charge is coupled from a reference source VREF+, VREF− to capacitors 70 and 72 by a first switching circuit 74. Charge is coupled from capacitors 70 and 72 to a summing junction 76 of an operational amplifier 78 in integrator 60 by a second switching circuit 80. A switched capacitor input circuit 82 couples charge from the input signal to summing junction 76 as described below.

The first switching circuit 74 includes a switch 90 connected between a positive input of the reference source and a first lead of capacitor 70, a switch 92 connected between a negative input of the reference source and a first lead of capacitor 72, a switch 94 connected between the positive input of the reference source and the first lead of capacitor 72, and a switch 96 connected between the negative input of the reference source and the first lead of capacitor 70. The switches 90 and 92 are controlled by clock phase 1, and the switches 94 and 96 are controlled by clock phase 2. Thus, charge is transferred to capacitors 70 and 72 during both clock phases.

The second switching circuit 80 includes a switch 100 connected between a second lead of capacitor 70 and a noninverting input 102 of operational amplifier 78, and a switch 104 connected between a second lead of capacitor 72 and an inverting input 106 of operational amplifier 78. The second switching circuit 80 further includes a switch 108 connected between a second lead of capacitor 70 and inverting input 106, and a switch 110 connected between a second lead of capacitor 72 and noninverting input 102. The switches in switching circuits 74 and 80 are preferably implemented as CMOS transistors. Preferably, both plates of each capacitor are fabricated of polysilicon material.

The switches 100, 104, 108 and 110 are controlled by data dependent control signals. In particular, switches 100 and 104 are controlled by a first control signal $\Phi_2 \bullet X + \Phi_1 \bullet XI$, where $\Phi_1$ and $\Phi_2$ represent clock phase 1 and clock phase 2, respectively, X and XI represent input data and inverted input data, respectively, from comparator 58, "•" represents a logical AND operation and "+" represents a logical OR operation. Switches 108 and 110 are controlled by a second control signal $\Phi_1 \bullet X + \Phi_2 \bullet XI$. The first and second control signals are generated by a logic unit 112 which receives clock phase one $\Phi_1$, clock phase two $\Phi_2$ and input data X and outputs the first and second control signals. Logic circuitry for generating the first and second control signals is well known to those skilled in the art.

The data dependent switching utilized in one-bit DAC 52 delivers charge to summing junction 76 on both clock phases. More particularly, the data dependent switching utilized insures that each of the switches 100, 104, 108 and 110 is closed during each clock cycle, regardless of the state of the input data. Thus, double sampling operation is obtained, and double the charge is transferred to summing junction 76 in comparison with prior art circuits which transfer charge on only one clock phase. This permits the size of the capacitors 70 and 72 to be reduced by a factor of two, while obtaining the same charge transfer as prior art circuits.

A clock (not shown) utilized in the sigma delta modulator of FIG. 2 generates clock phase 1 and clock phase 2, which are nonoverlapping in time. The one-bit DAC of the present invention requires that the input data from comparator 58 change state between clock phases.

In the switched capacitor input circuit 82, the positive side of the input signal is connected through a switch 120 to a first lead of a capacitor 122. A negative side of the input signal is connected through a switch 124 to a first lead of a capacitor 126. The positive side of the input signal is connected through a switch 128 to the first lead of capacitor 126, and the negative side of the input signal is connected through a switch 130 to the first lead of capacitor 122. Switches 128 and 130 are controlled by clock phase 1, and switches 120 and 124 are controlled by clock phase 2. A second lead of capacitor 122 is connected through a switch 132 to the inverting input 106 of operational amplifier 78 and through a switch 134 to the noninverting input 102 of operational amplifier 78. A second lead of capacitor 126 is connected through a switch 136 to the noninverting input 102 and through a switch 138 to the inverting input 106. Switches 132 and 136 are controlled by clock phase 1, and switches 134 and 138 are controlled by clock phase 2. The input circuit 82 delivers charge from the capacitors 122 and 126 to the summing junction 76 on both clock phases. Thus, charge is delivered to the summing junction 76 by input circuit 82 and one-bit DAC 52 at the same times on both clock phases. This prevents large voltage excursions at the output of the integrator 56 and permits larger dynamic ranges to be achieved.

While there have been shown and described what are at present considered the preferred embodiments of the present invention, which have been disclosed by way of example only, it will be obvious to those skilled in the art that various changes and modifications may be made therein without departing from the spirit and scope of the invention as presented above and as defined by the appended claims and equivalents thereto.

What is claimed is:

1. A switched capacitor one-bit digital-to-analog converter comprising:

first and second capacitors, each having a first lead and a second lead;

first switching means connected to the first leads of said capacitors for coupling charge from a reference source to said capacitors;

second switching means connected to the second leads of said capacitors for coupling charge from said capacitors to a positive output and a negative output, comprising a first switch connected between said first capacitor and said positive output, a second switch connected between said second capacitor and said negative output, a third switch connected between said first capacitor and said negative output, and a fourth switch connected between said second capacitor and said positive output;

means for applying a first control signal to said first and second switches, said first control signal comprising $\Phi_2 \bullet X + \Phi_1 \bullet XI$, where $\Phi_1$ and $\Phi_2$ represent clock phase 1 and clock phase 2, respectively, X and XI represent input data and inverted input data, respectively, "$\bullet$" represents a logical AND operation, and "+" represents a logical OR operation; and means for applying a second control signal to said third and fourth switches, said second control signal comprising $\Phi_1 \bullet X + \Phi_2 \bullet XI$.

2. A switched capacitor one-bit digital-to-analog converter as defined in claim 1 wherein said first, second, third and fourth switches comprise CMOS transistors.

3. A switched capacitor one-bit digital-to-analog converter as defined in claim 1 wherein said first switching means comprises a fifth switch connected between said first capacitor and a positive input from said reference source, a sixth switch connected between said second capacitor and a negative input from said reference source, a seventh switch connected between said first capacitor and the negative input from said reference source, and an eighth switch connected between said second capacitor and the positive input from said reference source, means responsive to said clock phase 1 for controlling said fifth and sixth switches, and means responsive to said clock phase 2 for controlling said seventh and eighth switches.

4. A switched capacitor one-bit digital-to-analog converter as defined in claim 3 wherein said fifth, sixth, seventh and eighth switches comprise CMOS transistors.

5. A sigma delta modulator comprising:

an integrator having a summing junction and providing an integrator output signal;

a comparator responsive to said integrator output signal for providing a comparator output signal having a first state when said integrator output signal is greater than a reference level and a second state when said integrator output signal is less than the reference level;

a switched capacitor one-bit digital-to-analog converter responsive to said comparator output signal for providing an error signal to said summing junction, said one-bit digital-to-analog converter comprising, first and second capacitors, each having a first lead and a second lead;

first switching means connected to the first leads of said capacitors for coupling charge from a reference source to said capacitors;

second switching means connected to the second leads of said capacitors for coupling charge from said capacitors to a positive output and a negative output, comprising a first switch connected between said first capacitor and said positive output, a second switch connected between said second capacitor and said negative output, a third switch connected between said first capacitor and said negative output, and a fourth switch connected between said second capacitor and said positive output;

means for applying a first control signal to said first and second switches, said first control signal comprising $\Phi_2 \bullet X + \Phi_1 \bullet XI$, where $\Phi_1$ and $\Phi_2$ represent clock phase 1 and clock phase 2, respectively, X and XI represent input data and inverted input data, respectively, "$\bullet$" represents a logical AND operation, and "+" represents a logical OR operation; and means for applying a second control signal to said third and fourth switches, said second control signal comprising $\Phi_1 \bullet X + \Phi_2 \bullet XI$; and a switched capacitor input circuit for coupling an input signal to said summing junction.

6. A sigma delta modulator as defined in claim 5 wherein said switched capacitor input circuit has a cross-coupled, double sampling structure such that charge is coupled to said summing junction by said input circuit and by said one-bit digital-to-analog converter on both clock phase 1 and clock phase 2.

7. A sigma delta modulator as defined in claim 5 wherein said first, second, third and fourth switches comprise CMOS transistors.

8. A sigma delta modulator as defined in claim 5 wherein said first switching means comprises a fifth switch connected between said first capacitor and a positive input from said reference source, a sixth switch connected between said second capacitor and a negative input from said reference source, a seventh switch connected between said first capacitor and the negative input from said reference source, and an eighth switch connected between said second capacitor and the positive input from said reference source, means responsive to said clock phase 1 for controlling said fifth and sixth switches, and means responsive to said clock phase 2 for controlling said seventh and eighth switches.

9. A sigma delta modulator as defined in claim 5 further including a two phase clock for generating clock phase 1 and clock phase 2, said clock phases being nonoverlapping in time.

10. A sigma delta modulator as defined in claim 9 wherein said comparator includes means for changing output states only between clock phases.

* * * * *